(12) United States Patent
Chang et al.

(10) Patent No.: US 7,529,985 B2
(45) Date of Patent: May 5, 2009

(54) MEMORY SIZE ALLOCATION DEVICE AND METHOD FOR INTERLEAVING

(76) Inventors: Alex Chang, 8F, No. 535, Chung Cheng Rd., Hsin Tien City, Taipei Hsien (TW); Aaron Wang, 8F, No. 535, Chung Cheng Rd., Hsin Tien City, Taipei Hsien (TW)

(*) Notice: Subject to any disclaimer, the term of this patent is extended or adjusted under 35 U.S.C. 154(b) by 581 days.

(21) Appl. No.: 11/028,545

(22) Filed: Jan. 5, 2005

(65) Prior Publication Data

US 2005/0278600 A1 Dec. 15, 2005

(30) Foreign Application Priority Data

Jun. 11, 2004 (TW) .............................. 93116899 A

(51) Int. Cl.
*G11C 29/18* (2006.01)
*G11C 29/46* (2006.01)

(52) U.S. Cl. ...................... 714/702; 714/763

(58) Field of Classification Search ............. 714/701, 714/702, 718, 763; 365/200, 201
See application file for complete search history.

(56) References Cited

U.S. PATENT DOCUMENTS 4,559,625 A * 12/1985 Berlekamp et al. .......... 714/701
6,151,690 A * 11/2000 Peeters ....................... 714/701
6,823,438 B2 * 11/2004 Hooper et al. ............... 711/170
2001/0024410 A1 * 9/2001 Kumai et al. ............ 369/47.24

FOREIGN PATENT DOCUMENTS

JP 2003023358 A * 1/2003

OTHER PUBLICATIONS

Ventura-Traveset et al., Impact of Diversity Reception on Fading Channels with Coded Modulation—Part I: Coherent Detection, IEEE Transactions on Communications, vol. 45, Issue 5, May 1997, pp. 563-572.*

* cited by examiner

*Primary Examiner*—Cynthia Britt
*Assistant Examiner*—Dipakkumar Gandhi
(74) *Attorney, Agent, or Firm*—Perkins Coie LLP

(57) ABSTRACT

A method and device for interleaving the (N+1) input data and for allocating the corresponding memory comprises the steps of allocating a $m_{th}$ buffer section equals to (m×Dm+Pm) memory address for buffering the $m_{th}$ data of the N+1 input data, where m is a nonnegative integer from 0, 1 to N, Dm is the delay of the $m_{th}$ data, and Pm is a nature number representing a predetermined number of memory address for extra buffering the $m_{th}$ data; assigning an empty memory address in the $m_{th}$ buffer section to buffer the $m_{th}$ data; accessing the $m_{th}$ data from where the $m_{th}$ data buffered after buffering the (N+1) data, and outputting the (N+1) data in a (m×Dm) delay sequence. The present invention allocates the memory address effectively, so applying the present invention economizes the use of the memory request.

29 Claims, 6 Drawing Sheets

A memory size allocation device and method for interleaving comprise an interleaver, a memory, an address allocation unit and an access control unit. The interleaver receives an input data cluster which has N+1 data items, and outputs the N+1 data items in a delay sequence m×Dm. The address allocation unit allocates a $m_{th}$ data item of the (N+1) data to a $m_{th}$ buffer section for buffering. The $m_{th}$ buffer section includes (m×Dm+Pm) memory addresses for buffering the $m_{th}$ data. The access control unit assigns an empty memory address in the $m_{th}$ data buffer section to buffer the $m_{th}$ data item so that the interleaver can buffer the $m_{th}$ data item in a selected memory address.

MEMORY SIZE ALLOCATION DEVICE AND METHOD FOR INTERLEAVING

BACKGROUND OF THE INVENTION (1) Field of the Invention

The present invention relates to an input data interleaving device and method, and more particularly to a memory size allocation device and method adopted for use in an interleaving process.

(2) Description of the Related Art

Data interleaving is a commonly used method for data protection to reduce error possibility during transmission. Before the data interleaving is adopted, data are transmitted by individual cluster. Namely the non-interleaved data are transmitted by a cluster at an interval unit to the receiving end. During the data transmission process, transmission environments or other factors often cause data loss. As a result, data missing could occur to the whole clustered data and the message could not be interpreted or understood. To remedy this problem, an interleaving process is often adopted before data transmission to delay transmission of a plurality of data in a cluster rather than transmit them together. Hence even if data loss occurred, it does not happen to the same cluster of data and is distributed in different data clusters. The loss impact can be minimized, and the message can still be interpreted.

Refer to FIG. 1 for a conventional interleaver 10 and a memory 12. For the input data contains two data clusters, and each data cluster has seven data items, the data items of the data clusters are input at each interval unit to the interleaver 10 which processes the input data according to an interleaving process, and the memory 12 buffers the data items not yet output according to the requirement of the interleaver 10. Under the coordination of the interleaver 10 and the memory 12, output of the data items in one cluster may be delayed. As shown in FIG. 1, in the time sequences T1 and T2, the interleaver 10 receives sequentially two data clusters G1 and G2. Each data cluster has seven data items marked respectively by $G1_0$~$G1_6$ and $G2_0$~$G2_6$. Then the interleaver 10 outputs data items according to a selected delay D (such as 1 T). Hence the interleaver 10 outputs data item $G1_0$ at T1, outputs data items $G1_1$ and G2 at T2, outputs data items $G1_2$ and $G2_1$ at T3, and so on, outputs data items $G1_6$ and $G2_5$ at T7, and outputs the last data item $G2_6$ at T8. By means of the aforesaid process, the data of two input data clusters become delayed output data through the interleaver 10. In practice, the interleaver 10 continuously receives and outputs data. Hence if there are seven data items in each input, the output after the interleaving process also have seven data items belong to input data items of different sequence. Therefore the probability of losing the entire data cluster decreases.

The interleaver 10 initially buffers the delay output data in the memory 12, then outputs the data items when the output process arrives. In the conventional memory 12, the allocated memory size has to be at least (N+1)×ND to sustain the buffered data during the output process without being overlaid by the follow on input data. N+1 is the number of data items in each data cluster. ND is the output sequence of the last data item. Take FIG. 1 as an example, there are 6+1 data items, the maximum delay is 6D, given the condition of D=T=1, the memory 12 has to include at least (6+1)×6=42 memory addresses to buffer the continuously input data clusters.

While the conventional approach for memory allocation can prevent the delayed data to be overlaid by the follow on input data, it wastes a lot of memory addresses because of each data cluster includes N+1 data items and occupies N+1 memory addresses after input. These memory addresses are reserved for data cluster buffering and released for input data cluster until the last data item of the data cluster has been output. The previous discussion indicates that the data items in the data clusters are output sequentially. When the last data item is output, the buffered memory addresses no longer have buffered data. To release the buffered memory for the follow on input data clusters until the last data item is output causes waste of memory addresses and a lower memory utilization efficiency. There is a need to develop an improved memory size allocation system and method to free the memory address that originally buffers a certain data item of a data cluster after that data item has been output and release the memory address for the follow on data to use.

SUMMARY OF THE INVENTION

Accordingly, it is an object of the present invention to provide a memory size allocation device adopted for use on an interleaver. The interleaver aims to perform interleaving process for an input data which contain selected number. N+1 of input data items, and buffer the N+1 data items in a memory, then output the data items in a delay sequence m×Dm, where Dm is the delay of $m_{th}$ data item, and m is an integer of 0, 1 to N. The memory size allocation device includes an address allocation unit to allocate a $m_{th}$ data item of the (N+1) data to a $m_{th}$ buffer section for buffering, the $m_{th}$ buffer section including (m×Dm+Pm) memory addresses, where Pm is a nature number representing a predetermined number of memory address for extra buffering the $m_{th}$ data; and an access control unit to assign an empty memory address in the $m_{th}$ data buffer section to buffer the $m_{th}$ data item so that the interleaver can buffer the $m_{th}$ data item in a selected memory address. When the interleaver intends to output the $m_{th}$ data item, it is notified to retrieve the $m_{th}$ data item from the selected memory address for outputting.

It is another object of the present invention to provide an interleaving device to interleave and buffer a plurality of data clusters. Each data cluster includes a plurality of data items such as N+1 items. The interleaving device includes a memory which contains many memory addresses for buffering the data of the data clusters and an interleaver for buffering the N+1 data items of each data cluster in the N+1 memory addresses according to their output delays. After L data items (L<N+1) of the data cluster have been output, the original buffer memory addresses for the L data items are idled, the interleaver buffers the data in the follow on data clusters in the idled memory addresses.

It is yet another object of the present invention to provide a method for interleaving and buffering data. According to the method, N+1 data items of a $X_{th}$ data cluster are stored respectively in many memory addresses in a memory according to their intended output time differences. After L data items (L<N+1) of the $X_{th}$ data cluster have been output, data in the follow on data clusters may be input and buffered in the idled memory addresses.

The present invention can dynamically adjust the memory address and release the memory address according to data output conditions for buffering the follow on data. Namely, after the data have been interleaved and output, the original buffered memory address is released to buffer the follow on input data. Hence the present invention can use less memory space to buffer same amount of data and increase memory utilization efficiency, and also reduce the memory cost.

DESCRIPTION OF THE PREFERRED EMBODIMENTS

In view of the conventional interleaving technique which does not effectively allocate the memory size and results in waste of memory capacity, the present invention discloses a novel memory size allocation system and method that adopt an interleaving process to improve memory utilization efficiency.

Figure 1:
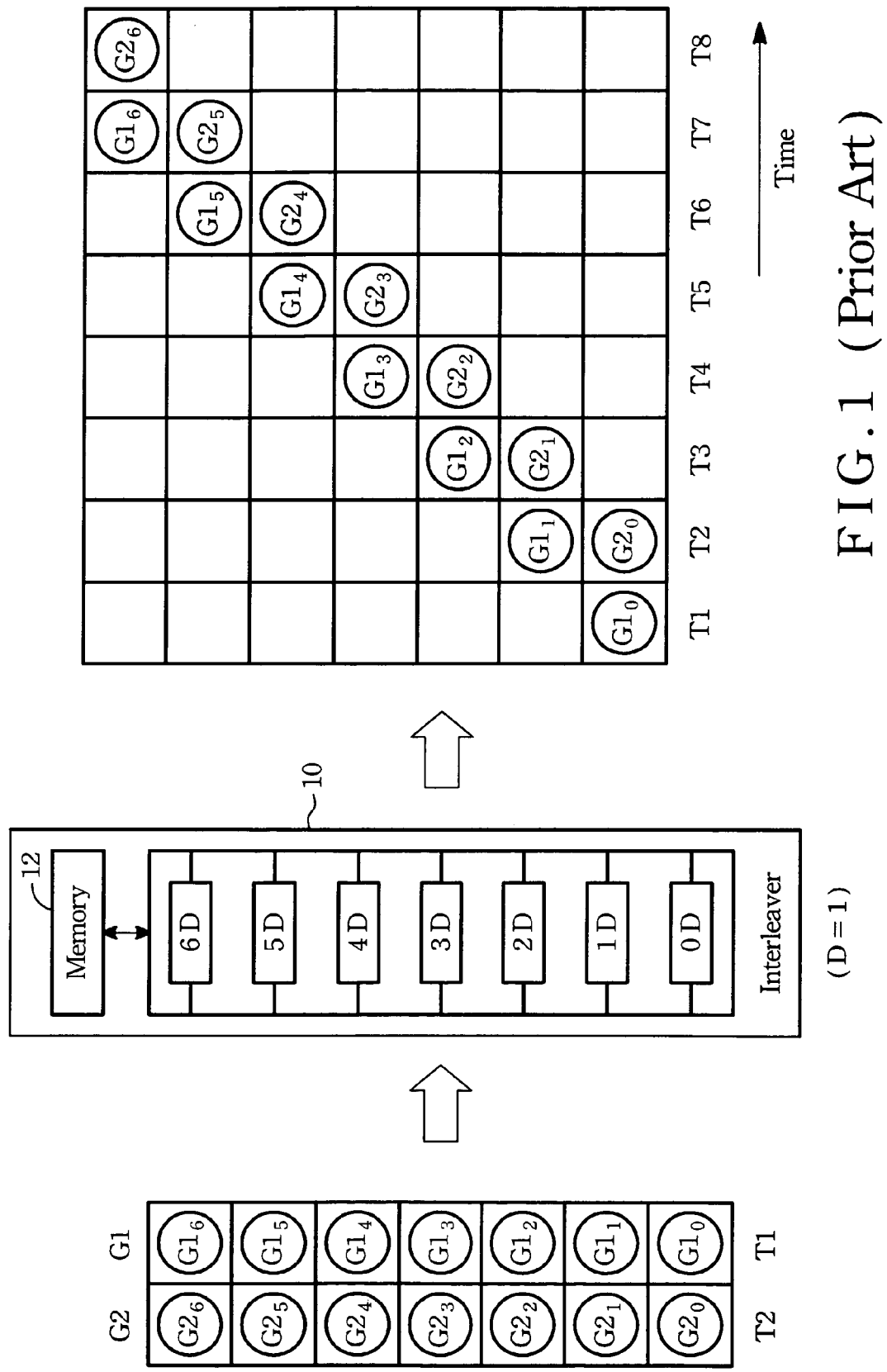
FIG. 1 is a schematic view of a conventional interleaver 10 and a memory 12.
Figure 2:
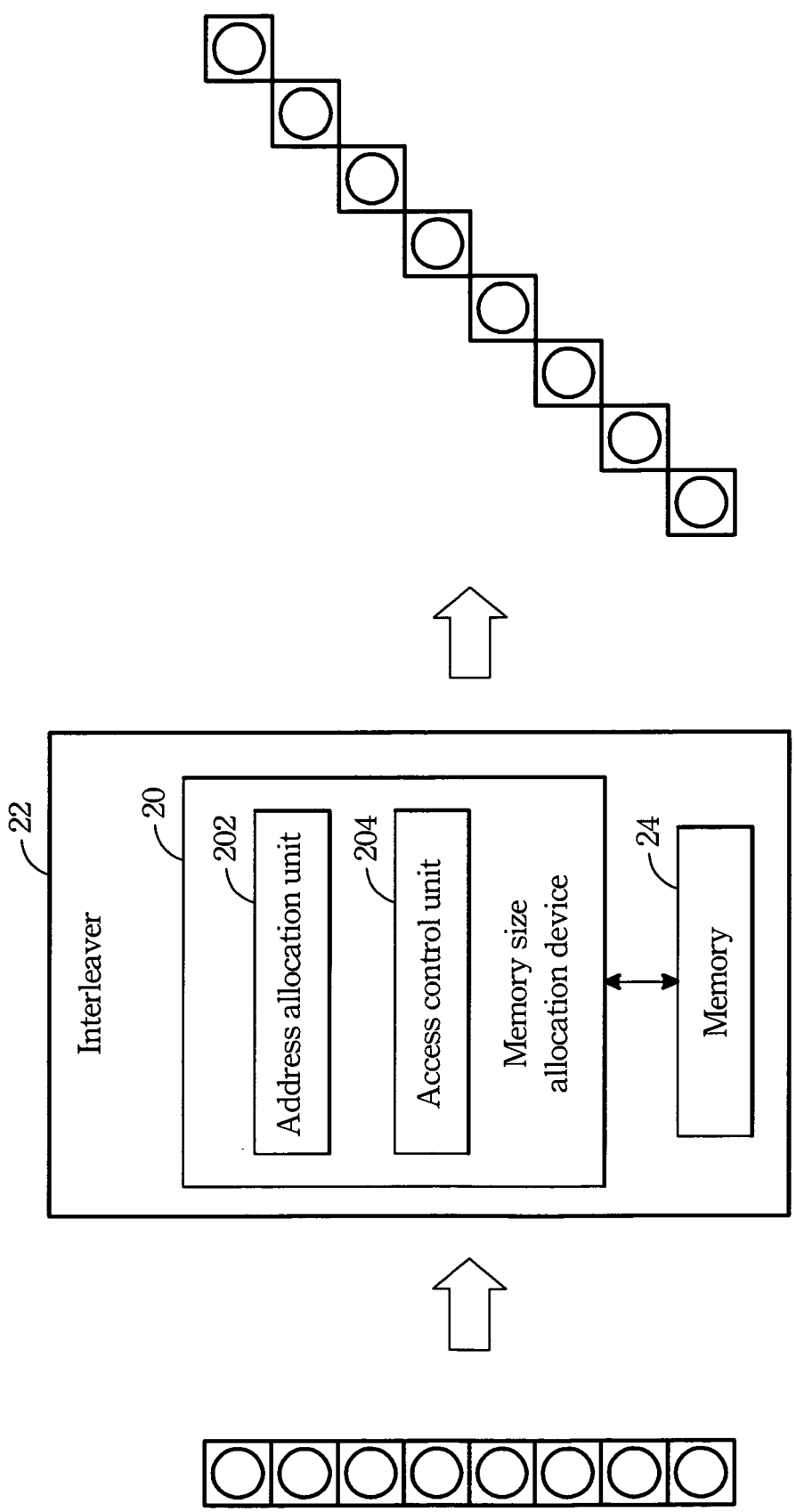
FIG. 2 is a schematic view of the present invention showing the memory size allocation device, interleaver and memory.

Referring to FIG. 2, the present invention includes a memory size allocation system 20, an interleaver 22 and a memory 24. The interleaver 22 receive input of data clusters continuously and buffer the data clusters in the memory 24, then output the data of each data cluster in an interleaving fashion. Each data cluster includes a selected number of data items (N+1) that may vary in different conditions, and is generally indicated by N+1 hereinafter. The data clusters are input continuously into the interleaver 22. To facilitate discussion, using the interleaver 22 to process a single data cluster is taken as an example.

As shown in FIG. 2, the input data cluster includes seven data items. After the data have been input into the interleaver 22, the interleaver 22 interleaves the data according to an interleaving logic. According to an embodiment of the invention, the logic of the interleaver 22 is to output the 0 data item by a delay of $0 \times D_0$, output the first data item by a delay of $1 \times D_1$, and so on, and output the sixth data item at a delay of $6 \times D_6$. $D_0 \sim D_6$ are respectively the delay of each data item and are alterable according to user's design. Namely, the interleaver 22 outputs the input N data items individually in the delay sequence of $m \times D_m$. Where N+1 is the data item number in the data cluster, m is the $m_{th}$ data item of the N+1 data, $D_m$ is the delay of the $m_{th}$ data item, and m is an integer ranging from 0, 1 to N.

However, in order to enable the interleaver 22 to achieve the interleaving effect for the data in the data cluster, the memory 24 also has to buffer the delay output data. The memory size allocation device 20 of the present invention aims to improve the memory utilization efficiency. After a buffered data in a memory address has been output, that memory address is released for a follow on input data cluster to use. Hence the memory address does not wait until the output of the last data item of the data cluster before being released for the follow on data cluster to use. Therefore memory utilization efficiency increases.

The present invention also takes into account the delay of each data item, and a buffer section is allocated in the memory for the data of each data cluster that are in the same sequence (such as five data items in a first data cluster and five data items in a second data cluster) to provide a desired number of memory addresses to buffer the data items of the same sequence so that the data of the same sequence are not overlaid before being output. To achieve the foregoing effect, the memory size allocation device 20 of the present invention includes an address allocation module 202 and a data access control module 204. The address allocation module 202 is provided to indicate the interleaver 22 where to buffer the currently input data item of the data cluster; and the data access control module 204 is provided to indicate the interleaver 22 where to retrieve the data item for outputting.

The address allocation module 202 allocates a $m_{th}$ buffer section for buffering the $m_{th}$ data item of the N+1 data. Take into account of the delay of each data item, the buffer section allocated by the address allocation module 202 for the $m_{th}$ data item includes (m×Dm+Pm) memory address. For example, the buffer section for the second data item of each data cluster includes $2 \times D_2 + P_2$ memory addresses.

The buffer section of the second data item includes $2 \times D_2 + P_2$ memory addresses, and output of the second data item is delayed by $2 \times D_2$. While the second data item is delayed and buffered in the memory 24, there are $2 \times D_2$ data clusters input continuously into the Interleaver 22 that include the second data items of the $2 \times D_2$ data clusters. Hence before the first second data item is output, the second data buffer section has to contain at least $2 \times D_2$ the second data items. Therefore the second data buffer section has to provide at least $2 \times D_2 + 1$ memory addresses to avoid data overlaying. Similarly, the delay condition also has to be considered for other $m_{th}$ data items, and the corresponding buffer section for the $m_{th}$ data items should have m×Dm+Pm memory addresses. Pm is a constant for designers and is a nature number with the value of one or more.

Figure 3:
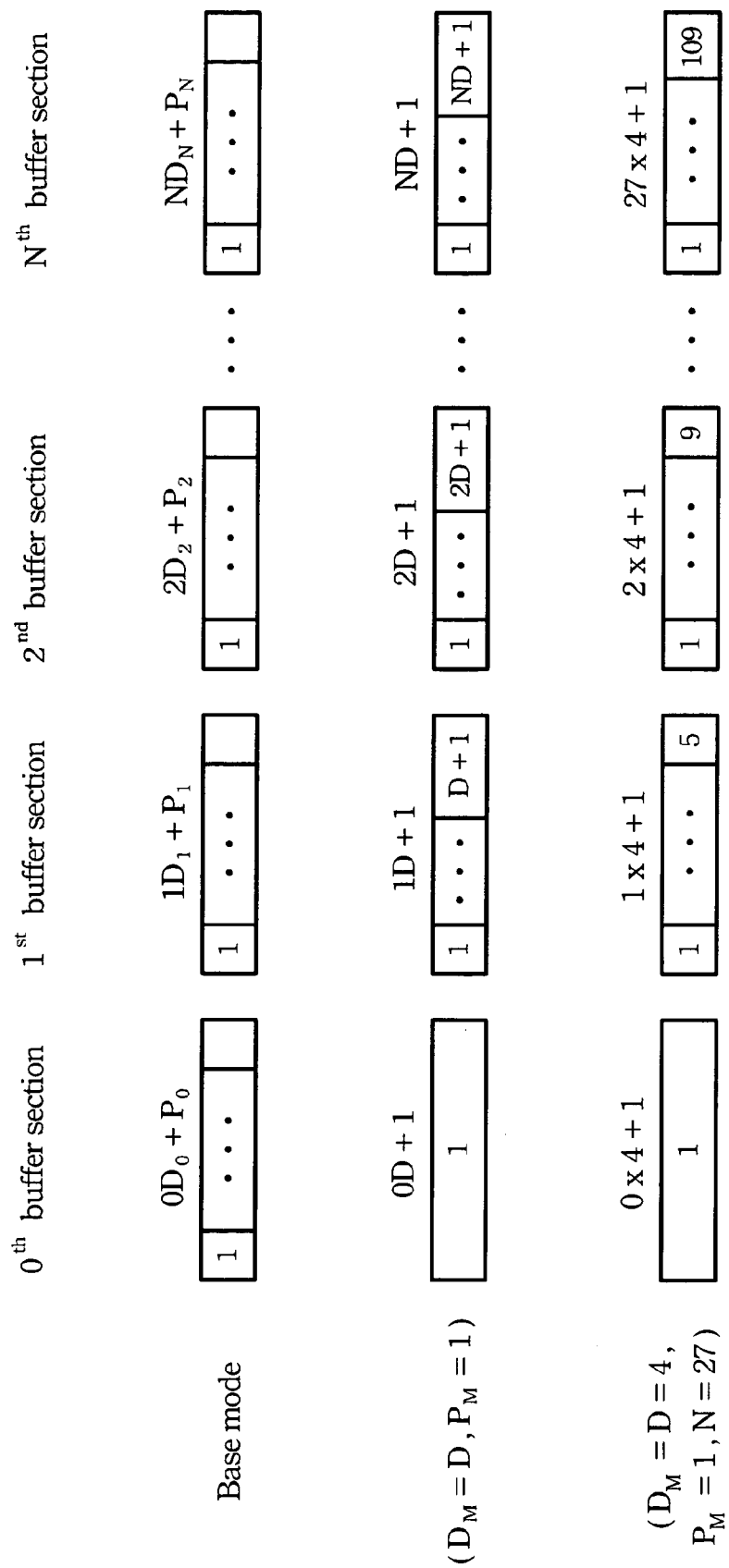
FIG. 3 is schematic view of the $m_{th}$ buffer section in the memory 24 shown in FIG. 2.

Refer to FIG. 3 for the buffer section of the $m_{th}$ data item in the memory 24 shown in FIG. 2. As the buffer section of each data item requires m×Dm+Pm memory addresses, the total memory address requirement of the invention is $\Sigma$ (m×Dm+Pm). Set a selected number D for the delay of each data item Dm, and set 1 for Pm, after applying the present invention, the memory address requirement is $\Sigma$ (m×D+1). Under the conventional technique, the memory capacity requirement is (N+1)×ND. Compared the two, presuming that (N+1)×ND>$\Sigma$ (m×D+1)=(ND+2)×(N+1)/2, only in the condition of ND>2 will the memory requirement of the invention be less than that of the conventional technique. In the event that the present invention is adopted in the interleaving of optical storage technique, such as a CD-ROM system, due to the optical storing technique specification set N=27, D=4, the conventional technique requires (27+1)×27×4=3024 memory addresses, by contrast, the invention needs only (27×4+2)×(27+1)/2=1540 memory addresses. Thus the present invention can save nearly 50% of memory requirement.

After the buffer section of each data item has been determined, the access control module 204 assigns the correct buffer address. The access control module 204 assigns an empty memory address in the $m_{th}$ data item buffer section of the memory 24 to allow the interleaver 22 to buffer the $m_{th}$ data. When the interleaver 22 outputs the $m_{th}$ data item, the interleaver 22 is notified to retrieve the $m_{th}$ data item from that address and output. Hence after the access control module 204 retrieved the data, the address allocation module 202 is notified that that memory address is idle, and may buffer the follow on input data.

Figure 4:
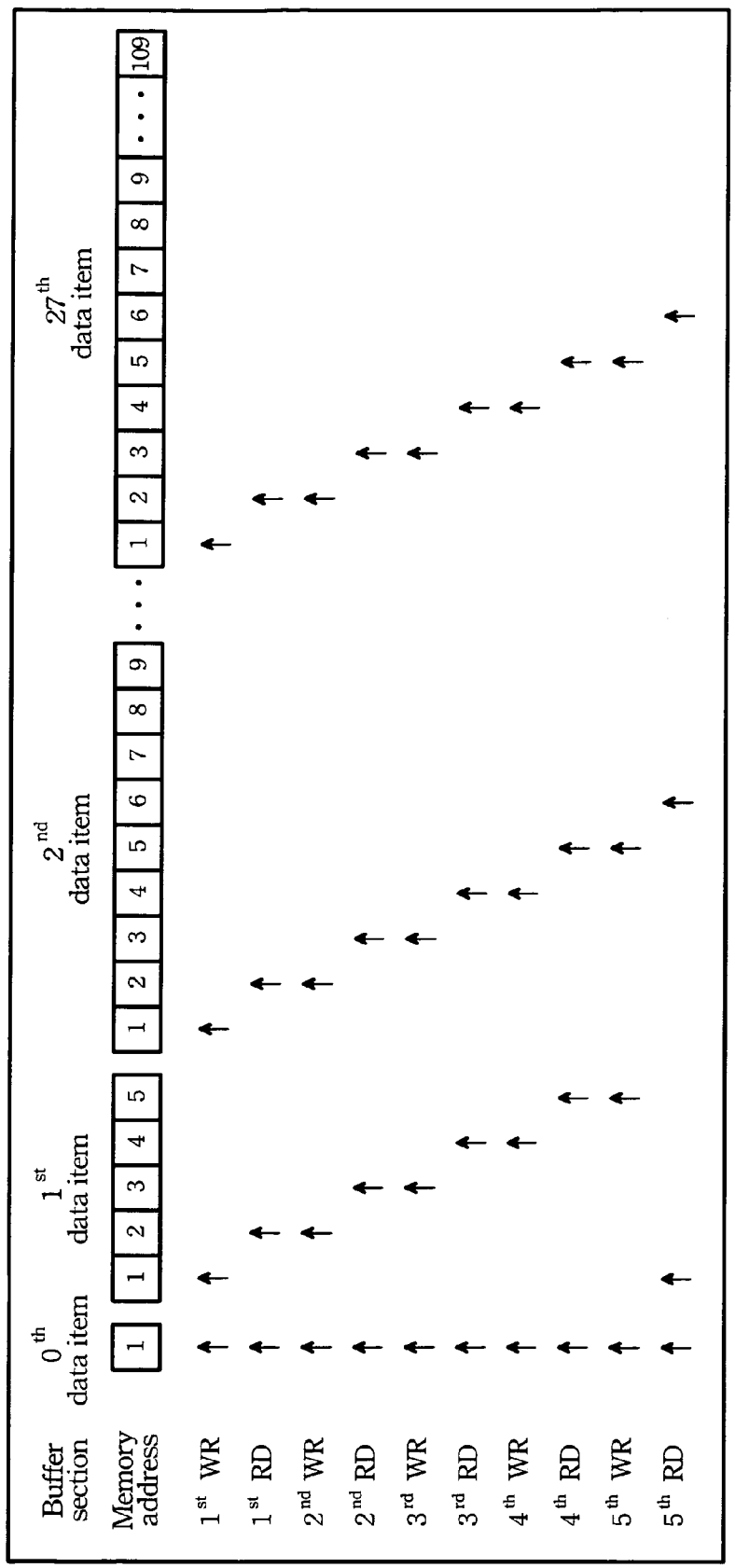
FIG. 4 is a schematic view of an embodiment of writing sequence provided by the access control unit shown in FIG. 2.
Figure 5:
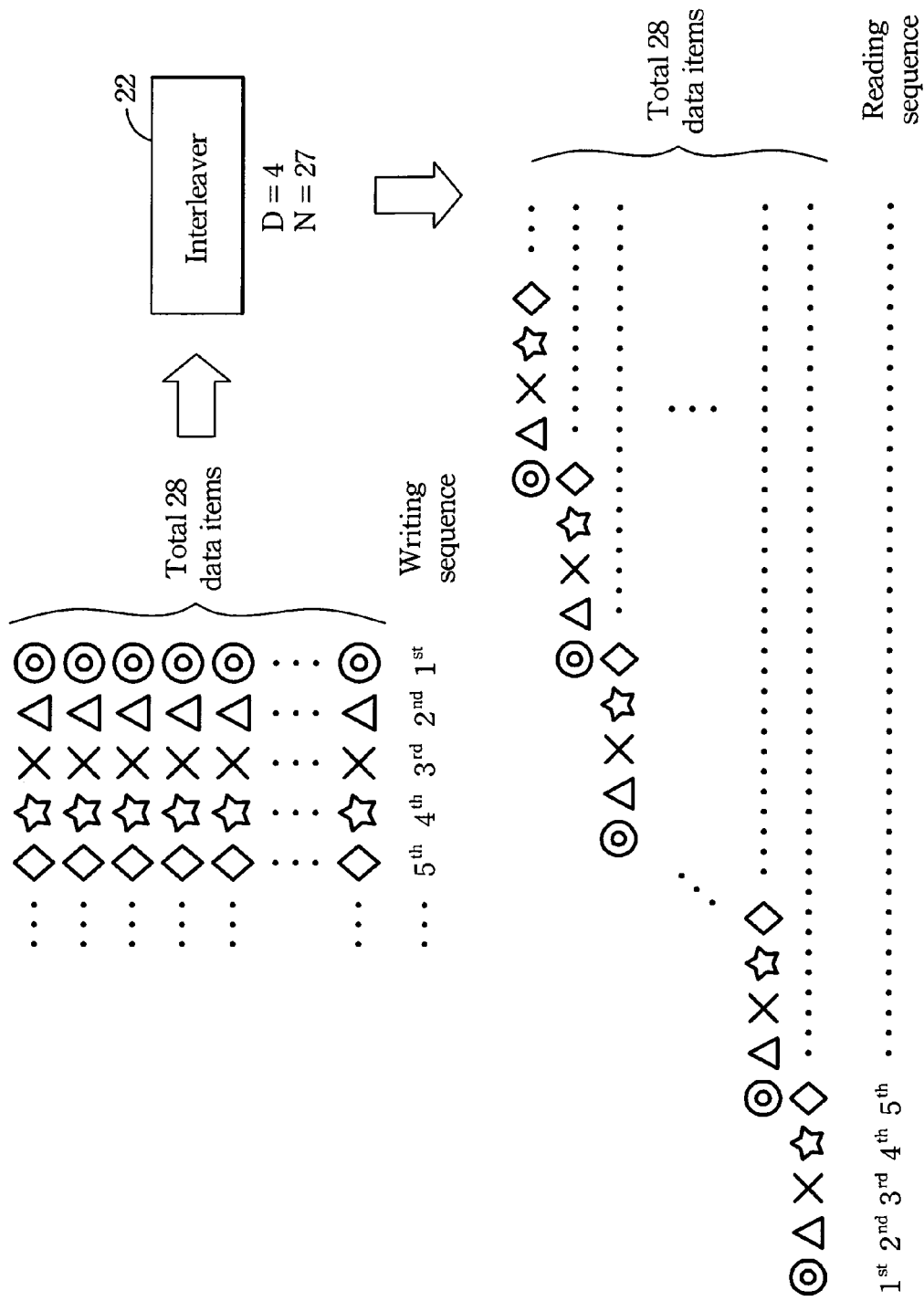
FIG. 5 is a schematic view of data input and output according to FIG. 4.

Refer to FIG. 4 and FIG. 5 for an embodiment of writing and reading of the access control unit 204 shown in FIG. 2, and data input and output according to FIG. 4. They are under the conditions of Dm=D=4 and N=27. Namely, the present invention is adopted in an embodiment of optical storage technique. The buffer section of the 0 data item has (0×4+1)=1 memory address, the buffer section of the first data item has (1×4+1)=5 memory addresses, the buffer section of the second data item has (2×4+1)=9 memory addresses, and so on, the buffer section of the 27th data item has (27×4+1)=109 memory addresses. In FIG. 5, five different patterns are used to represent five different data clusters and the contents of input data before and after interleaved. The embodiment serves only for illustrative purpose, and is not the limitation of the present invention.

Referring to FIG. 4, when the interleaver 22 inputs the first data cluster, namely inputs data in the first time, the access control unit 204 requests the interleaver 22 to write the 0 data item of the first data cluster into the memory address of the buffer section of the 0 data item, and write the first data item into the first memory address of the buffer section of the first data item, write the second data item into the first memory address of the buffer section of the second data item, and so on, and write the 27th data item into the first memory address of the buffer section of the 27th data item. Namely, all the data items in the first data cluster are buffered in the first memory address of the corresponding buffer section.

After input has finished, and the data are to be read and output, due to Dm=D=4, take into account of data output delay, the access control unit 204 requests the interleaver 22 to read the 0 data item stored in the memory address of the buffer section of the 0 data item, and also read the data stored in the second memory address of the buffer section of the first data item. As there is no corresponding data input at that moment, no effective data will be read. Meanwhile, the data stored in the second memory address of the buffer section of the second data item also is being read, and there is also no corresponding data input at that moment, therefore no effective data will be read, and so on. During reading at the first time, the second memory address of every buffer section is being read. Due to there is no data input except the buffer section of the 0 data item, only the 0 data item of the first data cluster is output.

After the first output is finished, the interleaver 22 inputs the second data cluster. As it is input of the second time, the access control unit 204 requests the interleaver 22 to buffer the $m_{th}$ data item in the second memory address of the buffer section of the $m_{th}$ data item to prevent overlaying the data of the first cluster previously stored. Since there is only one memory address at the buffer section of the 0 data item, data writing and reading of the 0 data item are proceeding at that address.

Similarly, after the second writing is finished, a second reading proceeds. As it is output for the second time, the access control unit 204 requests the interleaver 22 to output the $m_{th}$ data item buffered in the third memory address of the buffer section of the $m_{th}$ data item. However, except the buffer section of the 0 data item, the third memory address of other buffer sections also does not have buffer data, hence the second output outputs only the 0 data item of the second data cluster.

And the similar process goes on, the third input is to input into the third memory address of each buffer section, and the third output is to output the fourth memory address of each buffer section; until the fifth input and output, at that moment, the buffer section of the first data item has buffered the first data item of five different data clusters, and the buffer section of the first data item has only five memory addresses, hence during the fifth output, the access control unit 204 requests the interleaver 22 to read the first memory address of the buffer section of the first data item, and output the first data item of the first data cluster. Thus during the fifth output, the 0 data item of the fifth data cluster and the first data item of the first data cluster are output simultaneously. Similarly, during the ninth input and output, the buffer section of the second data item has buffered the second data item of nine different data clusters, and the buffer section of the second data item has only nine memory addresses. Hence during the ninth output, the access control unit 204 requests the interleaver 22 to read the first memory address of the buffer section of the second data item, and output the second data item of the first data cluster. Therefore, during the ninth output, the 0 data item of the ninth data cluster, the first data item of the fifth data cluster and the second data item of the first data cluster are output simultaneously.

In other words, when data are input into the interleaver 22, the access control unit 204 provides a writing address sequence to allow the interleaver 22 to write the $m_{th}$ data item of the data cluster into the corresponding $m_{th}$ buffer section. The writing address sequence is based on the remainder $W_{m,L}$ of the input sequence L divided by (m×Dm+Pm), namely the $m_{th}$ data item of the $L_{th}$ input data is written in the $W_{m,L}$ memory address of the $m_{th}$ buffer section, where L is a nature number. When the remainder $W_{m,L}$ is zero, the written address is the $(m×Dm+Pm)_{th}$ memory address of the buffer section of the $m_{th}$ data item. For example, for the 57th input, to calculate the buffer address of the 14th data item, the remainder $W_{14,57}=0$ is derived from 57/(14×4+1) first. Hence, the 14th data item of the 57th data cluster is to be buffered in the 57th memory address of the 14th buffer section derived by (14×4+1)=57. For the 100th input, and the 14th data item, the remainder $W_{14,100}=43$ is derived from 100/(14×4+1), hence the 14th data item of the 100th data cluster should be buffered in the $43_{th}$ memory address of the $14_{th}$ data buffer section.

Moreover, when the interleaver 22 outputs data, the access control unit 204 provides a reading address sequence to allow the interleaver 22 to interleave and read the buffered data in the memory 24. The reading address sequence is based on the remainder $R_{m,L}$ derived by the output sequence L plus 1 and divided by (m×Dm+Pm), namely the $m_{th}$ data item of the $L_{th}$ output data is read from the $R_{m,L}$ memory address of the $m_{th}$ buffer section. When the remainder $R_{m,L}$ is zero, the reading address is the $(m×Dm+Pm)_{th}$ memory address of the buffer section of the $m_{th}$ data item. As previously discussed, for the $57_{th}$ output, to calculate the reading address of the buffer address of the $14_{th}$ data item, the remainder $R_{14,57}=1$ is derived from (57+1)/(14×4+1). Hence, during the $57_{th}$ output, data buffered in the first memory address of the $14_{th}$ data buffer section is read. For the $100_{th}$ output, the $14_{th}$ data item is calculated according to the same principle, and the remainder $W_{14,100}=44$ is derived from (100+1)/(14×4+1), hence the data buffered in the $44_{th}$ memory address of the $14_{th}$ buffer section is read.

It is noted that the writing and reading address sequence provided by the access control unit 204 previously discussed is an embodiment under the assumption of Dm=D=4 and N=27. D and N may vary in other applications. The access address may also be not sequential. To those skilled in the art, many variations may be derived by referring to the aforesaid embodiment, and they shall still be deemed within the scope of the present invention.

Figure 6:
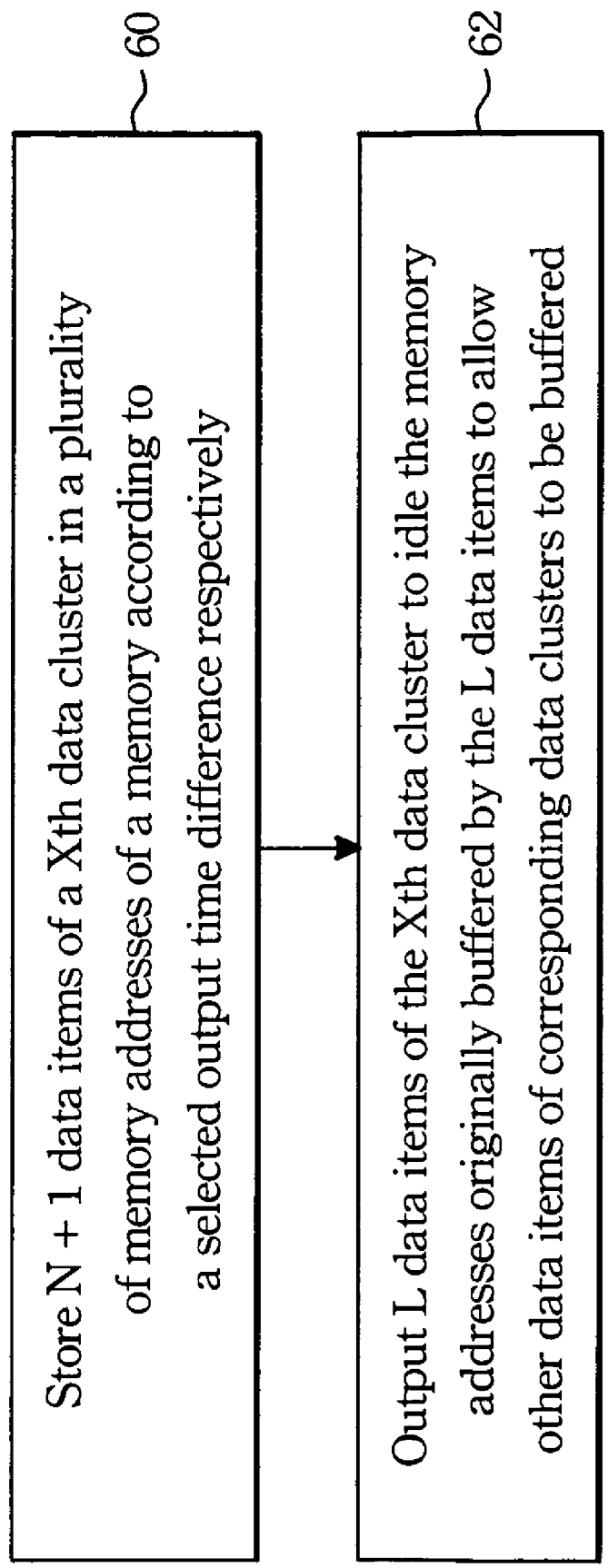
FIG. 6 is a process flow chart of the memory size allocation method of the present invention.

In order to facilitate implementation of the present invention, the method of the present invention is depicted as follow by referring to FIG. 6. First, storing respectively N+1 data items of a $X_{th}$ data cluster in many memory addresses of a memory according to a selected output time difference such as 1T second in step 60. Next, in step 62, outputting L data items of the $X_{th}$ data cluster to idle the memory addresses originally occupied by the L data items for following data items of following data clusters, where L is less than N+1.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

We claim:

1. A memory size allocation device used on an interleaver to process interleaving for an input data which contains a selected number (N+1) of data items, the interleaver buffering the N+1 data items in a plurality of memory addresses of a memory and outputting the N+1 data items in a delay sequence of m×Dm, where Dm is the delay of a $m_{th}$ data item and m is an integer ranging from 0, 1 to N, the memory size allocation device comprising:
   an address allocation unit for buffering each $m_{th}$ data item of the N+1 data in a $m_{th}$ buffer section which contains m×Dm+Pm memory addresses, where Pm is a number representing a predetermined number of the memory addresses for extra buffering of the $m_{th}$ data item; and
   an access control unit for assigning an empty memory address in the $m_{th}$ buffer section to allow the interleaver to buffer the $m_{th}$ data item therein and notifying the interleaver to retrieve the $m_{th}$ data item therefrom when the interleaver outputs the $m_{th}$ data item.

2. The memory size allocation device of claim 1, wherein the memory includes at least $\Sigma$(m×Dm+Pm) memory addresses.

3. The memory size allocation device of claim 1, wherein the access control unit provides a writing address sequence for the interleaver to buffer the $m_{th}$ data item in the $m_{th}$ buffer section when the interleaver inputs the input data, the writing address sequence being based on the remainder $W_{m,L}$ of a sequence L of the input data divided by (m×Dm+Pm) such that the $m_{th}$ data item of the $L_{th}$ input data is written in the $W_{m,L}$ memory address of the $m_{th}$ buffer section, where L is a positive integer; when $W_{m,L}$ is zero, the written address is the $(m\times Dm+Pm)_{th}$ memory address of the $m_{th}$ buffer section.

4. The memory size allocation device of claim 3, wherein the access control unit provides a reading address sequence to allow the interleaver to interleave and read the buffered data in the memory when the interleaver outputs data, the reading address sequence being based on the remainder $R_{m,L}$ derived by a sequence L of the output data plus 1 and divided by (m×Dm+Pm), such that the $m_{th}$ data item of the $L_{th}$ output data is read from the $R_{m,L}$ memory address of the m m$_{th}$ buffer section; when $R_{m,L}$ is zero, the reading address is the $(m\times Dm+Pm)_{th}$ memory address of the $m_{th}$ buffer section.

5. An interleaving device for interleaving and buffering a plurality of data clusters each having a plurality (N+1) of data items, comprising:
   a memory having a plurality of memory addresses for buffering the data items of the data clusters; and
   an interleaver for buffering the N+1 data items of each data cluster in N+1 memory addresses of the memory according to their output delay;
   wherein outputting of L data items (L<N+1) in the data clusters idles the memory addresses originally buffered by the L data items to allow the interleaver to buffer follow on data items of follow on data clusters in the idled memory addresses.

6. The interleaving device of claim 5 further including:
   an address allocation unit for buffering a $m_{th}$ data item of the N+1 data items in a $m_{th}$ buffer section which contains m×Dm+Pm memory addresses, where Dm is the delay of the $m_{th}$ data item, m is a nature number ranging from 0, 1 to N, and Pm is a positive integer representing a predetermined number of the memory addresses for extra buffering of the $m_{th}$ data item.

7. The interleaving device of claim 6 is adopted for use in optical storage techniques, where Dm=4, and N=27.

8. The interleaving device of claim 5 further including:
   an access control unit for assigning an empty memory address in the $m_{th}$ buffer section to allow the interleaver to buffer the $m_{th}$ data item therein and notifying the interleaver to retrieve the $m_{th}$ data item therefrom when the interleaver outputs the $m_{th}$ data item.

9. The interleaving device of claim 8, wherein the access control unit provides a writing address sequence for the interleaver to buffer the $m_{th}$ data item in the $m_{th}$ buffer section when the interleaver inputs data, the writing address sequence being based on the remainder $W_{m,L}$ of a sequence L of the input data divided by (m×Dm+Pm) such that the $m_{th}$ data item of the $L_{th}$ input data is written in the $W_{m,L}$ memory address of the $m_{th}$ buffer section, where L is a positive integer; when the $W_{m,L}$ is zero, the written address is the $(m\times Dm+Pm)_{th}$ memory address of the $m_{th}$ buffer section.

10. The interleaving device of claim 8, wherein the access control unit provides a reading address sequence to allow the interleaver to interleave and read the buffered data in the memory when the interleaver outputs data, the reading address sequence being based on the remainder $R_{m,L}$ derived by a sequence L of the output data plus 1 and divided by (m×Dm+Pm) such that the $m_{th}$ data item of the $L_{th}$ output data is read from the $R_{m,L}$ memory address of the $m_{th}$ buffer section; when the $R_{m,L}$ is zero, the reading address is the $(m\times Dm+Pm)_{th}$ memory address of the $m_{th}$ buffer section.

11. The interleaving device of claim 5, wherein the memory includes at least $\Sigma$(m×Dm+Pm) memory addresses.

12. A method for interleaving and buffering data comprising the steps of:
    storing respectively N+1 data items of a $X_{th}$ data cluster in a plurality of memory addresses of a memory according to a selected output time difference; and
    outputting L data items (L<N+1) of the $X_{th}$ data cluster to idle the memory addresses originally buffered by the L data items to allow follow on data items of follow on data clusters to be buffered in the idled memory addresses.

13. The method of claim 12 further including:
    allocating a $m_{th}$ buffer section which contains m×Dm+Pm memory addresses to each $m_{th}$ data item of the N+1 data items, wherein Dm is the delay of the $m_{th}$ data item, m is an integer ranging from 0, 1 to N, and Pm is a number representing a predetermined number of memory addresses for extra buffering of the $m_{th}$ data item;
    assigning an empty memory address in the $m_{th}$ buffer section to buffer the $m_{th}$ data item therein; and
    retrieving the $m_{th}$ data item from the empty memory address when the $m_{th}$ data item is output.

14. The method of claim 13 further including:
    providing a writing address sequence to buffer each $m_{th}$ data item of input data in a $m_{th}$ buffer section when the interleaving process inputs data, the writing address sequence being based on the remainder $W_{m,L}$ of a sequence L of the input data divided by (m×Dm+Pm) such that the $m_{th}$ data item of the $L_{th}$ input data is written in the $W_{m,L}$ memory address of the $m_{th}$ buffer section, where L is a positive integer; when the $W_{m,L}$ is zero, the written address is the $(m\times Dm+Pm)_{th}$ memory address of the $m_{th}$ buffer section.

15. The method of claim 13 further including:
providing a reading address sequence to interleave and read data in the memory when the interleaving process outputs the data, the reading address sequence being based on a remainder $R_{m,L}$ derived by a sequence L of the output data plus 1 and divided by (m×Dm+Pm) such that the $m_{th}$ data item of the $L_{th}$ output data is read from the $R_{m,L}$ memory address of the $m_{th}$ buffer section, when the $R_{m,L}$ is zero, the reading address is the (m×Dm+Pm)$_{th}$ memory address of the $m_{th}$ buffer section.

16. The method of claim 12, where Dm=4 and N=27 when the method is used in optical storage techniques.

17. A method for interleaving input data that contains a selected number of data items, comprising:
buffering by an interleaver N+1 data items in a plurality of memory addresses of a memory and outputting the N+1 data items in a delay sequence of m×Dm, where Dm is the delay of a $m_{th}$ data item and m is an integer ranging from 0, 1 to N;
buffering by an address allocation unit each $m_{th}$ data item of the N+1 data in a $m_{th}$ buffer section that contains m×Dm+Pm memory addresses, where Pm is a number representing a predetermined number of the memory addresses for extra buffering of the $m_{th}$ data item; and
assigning by an access control unit an empty memory address in the $m_{th}$ buffer section to allow the interleaver to buffer the $m_{th}$ data item therein and notifying the interleaver to retrieve the $m_{th}$ data item therefrom when the interleaver outputs the $m_{th}$ data item.

18. The method of claim 17, the method further comprising:
providing by the access control unit a writing address sequence for the interleaver to buffer the $m_{th}$ data item in the $m_{th}$ buffer section when the interleaver inputs the input data.

19. The method of claim 18, wherein the writing address sequence is based on a remainder $W_{m,L}$ of a sequence L of the input data divided by (m×Dm+Pm), such that the $m_{th}$ data item of the $L_{th}$ input data is written in the $W_{m,L}$ memory address of the $m_{th}$ buffer section, where L is a positive integer.

20. The method of claim 17, the method further comprising:
providing by the access control unit a reading address sequence to allow the interleaver to interleave and read the buffered data in the memory when the interleaver outputs data.

21. The method of claim 20, wherein the reading address sequence is based on a remainder $R_{m,L}$ derived by a sequence L of the output data plus 1 and divided by (m×Dm+Pm), such that the $m_{th}$ data item of the $L_{th}$ output data is read from the $R_{m,L}$ memory address of the $m_{th}$ buffer section.

22. The method of claim 17, wherein the memory includes at least Σ(m×Dm+Pm) memory addresses.

23. A computer readable storage medium storing computer-executable instructions that, when executed, perform a method for interleaving input data, the method comprising:
buffering by an interleaver N+1 data items in a plurality of memory addresses of a memory and outputting the N+1 data items in a delay sequence of m×Dm, where Dm is the delay of a $m_{th}$ data item and m is an integer ranging from 0, 1 to N;
buffering by an address allocation unit each $m_{th}$ data item of the N+1 data in a $m_{th}$ buffer section that contains m×Dm+Pm memory addresses, where Pm is a number representing a predetermined number of the memory addresses for extra buffering of the $m_{th}$ data item; and
assigning by an access control unit an empty memory address in the $m_{th}$ buffer section to allow the interleaver to buffer the $m_{th}$ data item therein and notifying the interleaver to retrieve the $m_{th}$ data item therefrom when the interleaver outputs the $m_{th}$ data item.

24. The computer readable storage medium of claim 23, wherein the method further comprises:
providing by the access control unit a writing address sequence for the interleaver to buffer the $m_{th}$ data item in the $m_{th}$ buffer section when the interleaver inputs the input data containing the N+1 data items.

25. The computer readable storage medium of claim 23, wherein the method further comprises:
providing by the access control unit a reading address sequence to allow the interleaver to interleave and read the buffered data in the memory when the interleaver outputs data.

26. A computer readable storage medium storing computer-executable instructions that, when executed, performs a method for interleaving and buffering data, the method comprising:
storing N+1 data items of an $X_{th}$ data cluster in multiple memory addresses of a memory according to a selected output time difference; and
outputting L data items (L<N+1) of the $X_{th}$ data cluster to idle a set of memory addresses originally buffered by the L data items to allow follow-on data items of follow-on data clusters to be buffered in the idled memory addresses.

27. The computer readable storage medium of claim 26, wherein the method further includes:
allocating an $m_{th}$ buffer section which contains m×Dm+Pm memory addresses to each $m_{th}$ data item of the N+1 data items, wherein Dm is the delay of the $m_{th}$ data item, m is an integer ranging from 0, 1 to N, and Pm is a number representing a predetermined number of memory addresses for extra buffering of the $m_{th}$ data item;
assigning an empty memory address in the $m_{th}$ buffer section to buffer the $m_{th}$ data item therein; and
retrieving the $m_{th}$ data item from the empty memory address when the $m_{th}$ data item is output.

28. Computer readable storage medium of claim 27, wherein the method further includes:
providing a writing address sequence to buffer each $m_{th}$ data item of input data in a $m_{th}$ buffer section when the interleaving process inputs data, the writing address sequence being based on a remainder $W_{m,L}$ of a sequence L of the input data divided by (m×Dm+Pm) such that the $m_{th}$ data item of the $L_{th}$ input data is written in the $W_{m,L}$ memory address of the $m_{th}$ buffer section, where L is a positive integer.

29. The computer readable storage medium of claim 27, wherein the method further includes:
providing a reading address sequence to interleave and read data in the memory when the interleaving process outputs the data, the reading address sequence being based on a remainder $R_{m,L}$ derived by a sequence L of the output data plus 1 and divided by (m×Dm+Pm) such that the $m_{th}$ data item of the $L_{th}$ output data is read from the $R_{m,L}$ memory address of the $m_{th}$ buffer section.

* * * * *